United States Patent
Yu et al.

(10) Patent No.: US 6,914,509 B2
(45) Date of Patent: Jul. 5, 2005

(54) TRANSFORMER FORMER BETWEEN TWO LAYOUT LAYERS

(75) Inventors: Jay Yu, Hsin-Tien (TW); Jimmy Hsu, Hsin-Tien (TW); Nicole Li, Hsin-Tien (TW)

(73) Assignee: Via Technologies Inc., Hsin-Tien (TW)

( * ) Notice: Subject to any disclaimer, the term of this patent is extended or adjusted under 35 U.S.C. 154(b) by 47 days.

(21) Appl. No.: 10/610,539

(22) Filed: Jul. 2, 2003

(65) Prior Publication Data

US 2004/0196132 A1 Oct. 7, 2004

(30) Foreign Application Priority Data

Apr. 4, 2003 (TW) .......................................... 92107816 A

(51) Int. Cl.[7] .................................................. H01F 5/00
(52) U.S. Cl. ........................ 336/200; 336/232; 336/223
(58) Field of Search ................................. 336/200, 223, 336/232, 192; 29/602.1, 605

(56) References Cited

U.S. PATENT DOCUMENTS

| | | | | |
|---|---|---|---|---|
| 5,877,667 A | * | 3/1999 | Wollesen | 336/200 |
| 6,054,914 A | * | 4/2000 | Abel et al. | 336/200 |
| 6,097,273 A | * | 8/2000 | Frye et al. | 336/200 |
| 6,501,363 B1 | * | 12/2002 | Hwu et al. | 336/200 |
| 6,713,162 B2 | * | 3/2004 | Takaya et al. | 428/209 |
| 6,717,502 B2 | * | 4/2004 | Yue | 336/200 |
| 6,779,261 B2 | * | 8/2004 | Yue | 29/846 |

FOREIGN PATENT DOCUMENTS

JP 05-021243 1/1993

* cited by examiner

*Primary Examiner*—Anh Mai
(74) *Attorney, Agent, or Firm*—Winston Hsu

(57) ABSTRACT

A printed circuit transformer includes a first wiring layer, a second wiring layer, a primary conductive coil including a first conductive trace, a second conductive trace, a third conductive trace, and a fourth conductive trace, which are on the first wiring layer or the second wiring layer, a first via plug, a second via plug, and a third via plug for connecting the ends of the conductive traces in the primary conductive coil, and a secondary conductive coil including a fifth conductive trace, a sixth conductive trace, a seventh conductive trace, and a eighth conductive trace, which are on the first wiring layer or the second wiring layer, a fourth via plug, a fifth via plug, and a sixth via plug for connecting the ends of the conductive traces in the secondary conductive coil.

10 Claims, 9 Drawing Sheets

TRANSFORMER FORMER BETWEEN TWO LAYOUT LAYERS

BACKGROUND OF INVENTION

1. Field of the Invention

The present invention relates to a transformer, and more specifically, to a transformer formed between two layout layers.

2. Description of the Prior Art

As wireless communication progresses, passive devices such as inductors and transformers are widely used in circuit design for wireless communication. In the field of circuit design, a transformer can be a discrete device or integrated into a chip, however, the high power consumption of a chip may lower the quality level and increase the circuit design difficulties.

Please refer to FIG. 1 which is a layout diagram illustrating a conventional planar transformer 10 according to the prior art. As shown in FIG. 1, the planar transformer 10 includes a primary coil 12 and a secondary coil 14 both on a plane. The primary coil 12 and the secondary coil 14 include two differential signal ends P+, P− and S+, S− respectively. The primary coil 12 spirals inwards around point O from the end P+ to form a necessary number of loops, and then exits the plane from the end P−. The secondary coil 14 spirals inwards around point O from the end S+ to form a necessary number of loops, and then exits the plane from the end S−. The primary coil 12 and the secondary coil 14 are formed on a plane, spiraling alternately to keep from overlapping with each other. It is a disadvantage of the conventional planar transformer 10 that it needs a large-size layout to achieve a necessary inductance. Additionally, the conventional transformer 10 has a poor mutual inductance performance and is not easily applied to circuit design for wireless communication.

Please refer to FIG. 2. FIG. 2 is a layout diagram of a conventional two-level transformer 16 according to the prior art. In order to reduce layout area, as shown in FIG. 2, a two-level conductive coil is used to form the transformer 16. The transformer 16 includes a primary coil 18 and a secondary coil 20. The primary coil 18 and the secondary coil 20 include two differential signal ends P+, P− and S+, S− respectively. The primary coil 18 spirals inwards around point O from the end P+ to form a necessary number of loops, and then ends at the end P−. The secondary coil 20 spirals inwards around point O from the end S+ to form a necessary number of loops, and then ends at the end S−. The primary coil 18 and the secondary coil 20 are formed separately on two different planes. Please refer to FIG. 3 which is an equivalent circuit diagram of a transformer 16. The impedance conversion between differential signal ends P+, P− and S+, S− is determined by the ratio of the number of loops in the primary coil 18 to the number of loops in the secondary coil 20. Although the conventional two-level transformer 16 reduces chip area and increase mutual inductance between the two conductive coils when compared with the conventional planar transformer 10, since the two-level transformer 16 is not symmetrically formed, common mode noise cannot be reduced effectively.

As mentioned above, the conventional planar transformer 10 requires a larger layout area and increases cost. Additionally, a longer conductive coil causes a higher resistance, therefore it results in the inductor consuming more power and lowers the quality level. Although the two-level transformer 16 is capable of reducing layout area, it is not able to reduce common mode noise.

SUMMARY OF INVENTION

It is therefore a primary object of the present invention to provide a printed circuit transformer in order to solve the problems mentioned above.

Briefly summarized, a printed circuit transformer includes a first wiring layer, a second wiring layer formed under and parallel to the primary wiring layer, a primary coil and a secondary coil. The primary coil includes a first conductive trace formed on the first wiring layer, a second conductive trace formed on the second wiring layer, a third conductive trace formed on the first wiring layer and parallel to the first conductive trace, a fourth conductive trace formed on the second wiring layer and parallel to the second conductive trace, a first via plug connected to a first end of the first conductive trace and a first end of the second conductive trace, a second via plug connected to a second end of the second conductive trace and a first end of the third conductive trace, and a third via plug connected to a second end of the third conductive trace and a first end of the fourth conductive trace. The secondary coil includes a fifth conductive trace formed on the first wiring layer and parallel to the first conductive trace, a sixth conductive trace formed on the second wiring layer and parallel to the second conductive trace, a seventh conductive trace formed on the first wiring layer and parallel to the third conductive trace, an eighth conductive trace formed on the second wiring layer and parallel to the fourth conductive trace, a fourth via plug connected to a first end of the fifth conductive trace and a first end of the sixth conductive trace, a fifth via plug connected to a second end of the sixth conductive trace and a first end of the seventh conductive trace, and a sixth via plug connected to a second end of the seventh conductive trace and a first end of the eighth conductive trace.

These and other objects of the present invention will no doubt become obvious to those of ordinary skill in the art after reading the following detailed description of the preferred embodiment that is illustrated in the various figures and drawings.

DETAILED DESCRIPTION

Figure 1:
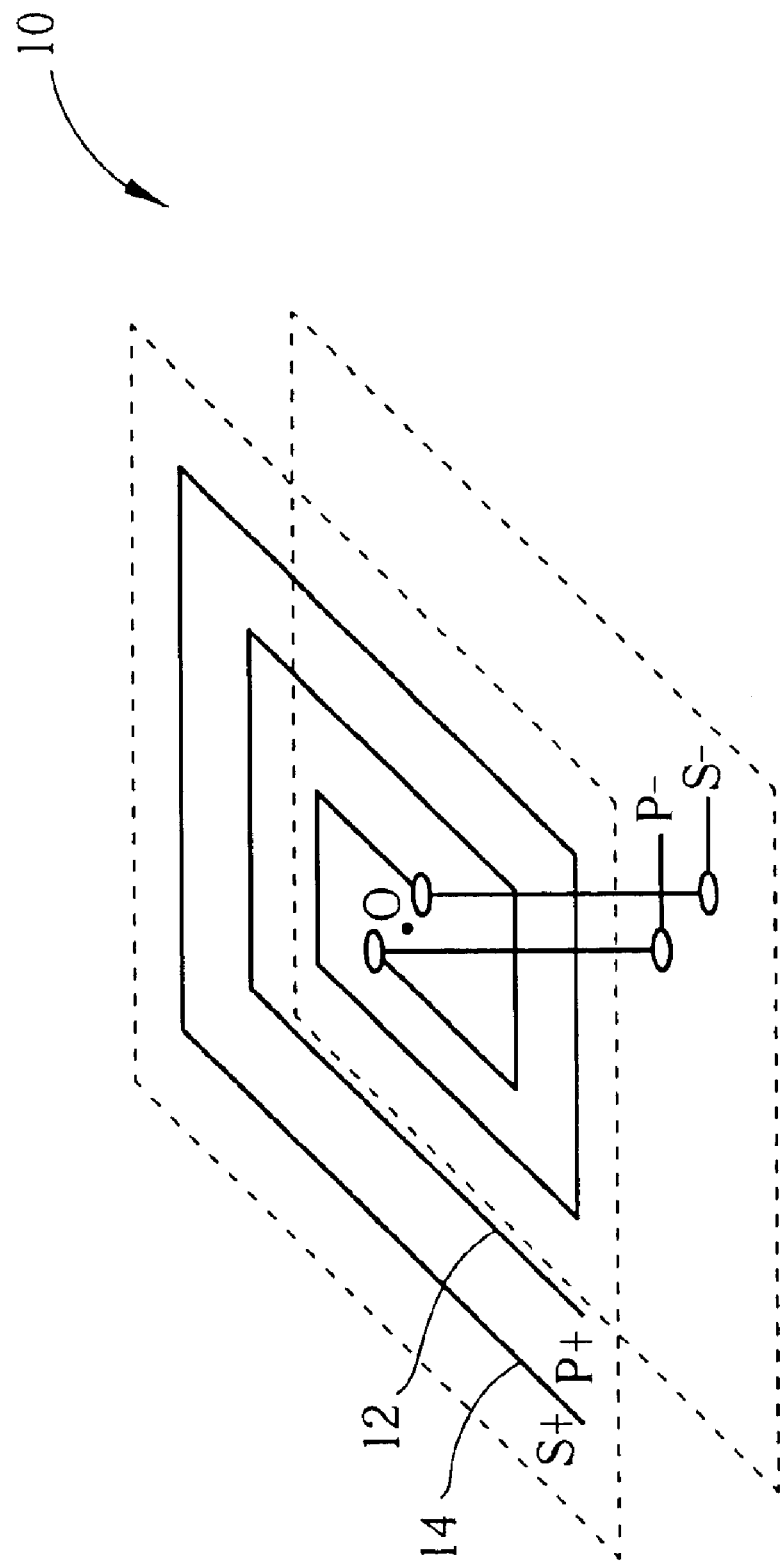
FIG. 1 is a layout diagram illustrating a conventional planar transformer according to the prior art.
Figure 2:
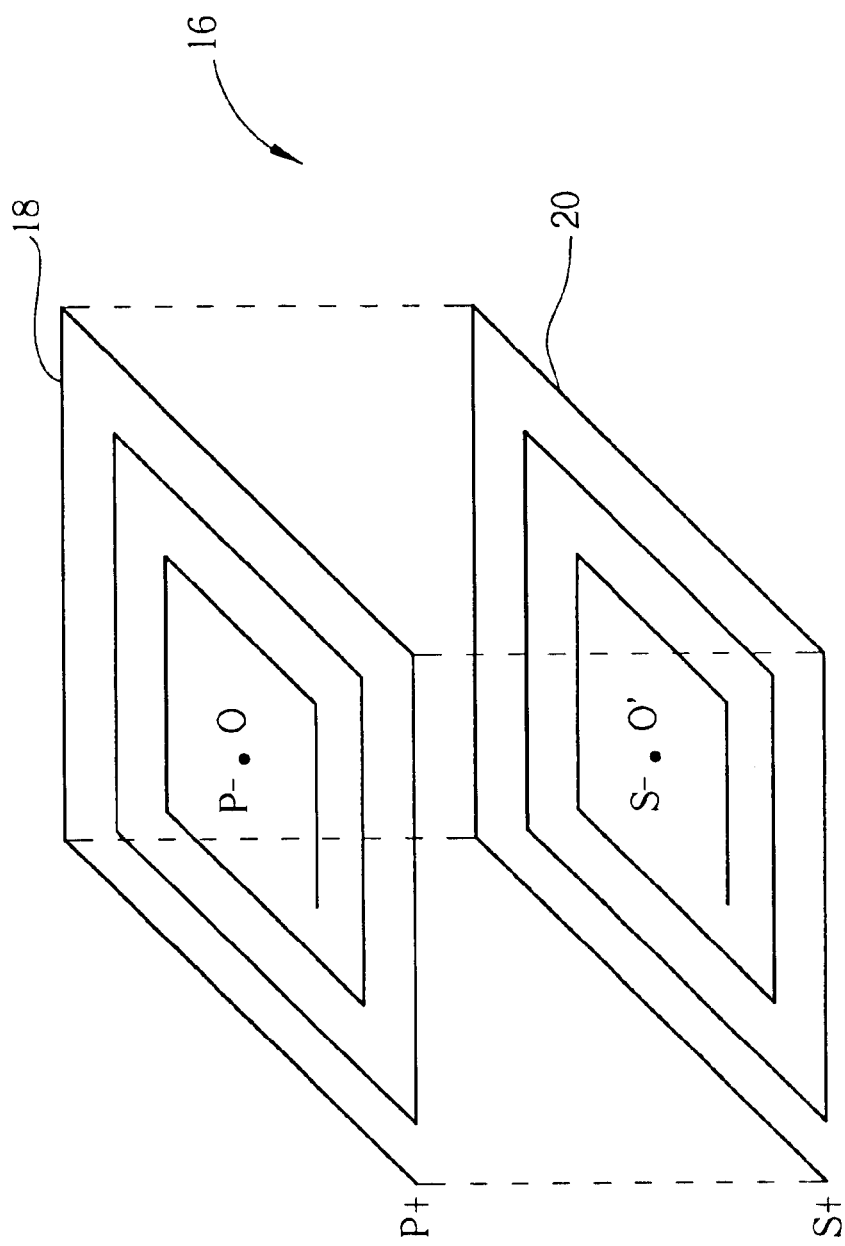
FIG. 2 is a layout diagram of a conventional two-level transformer according to the prior art.
Figure 3:
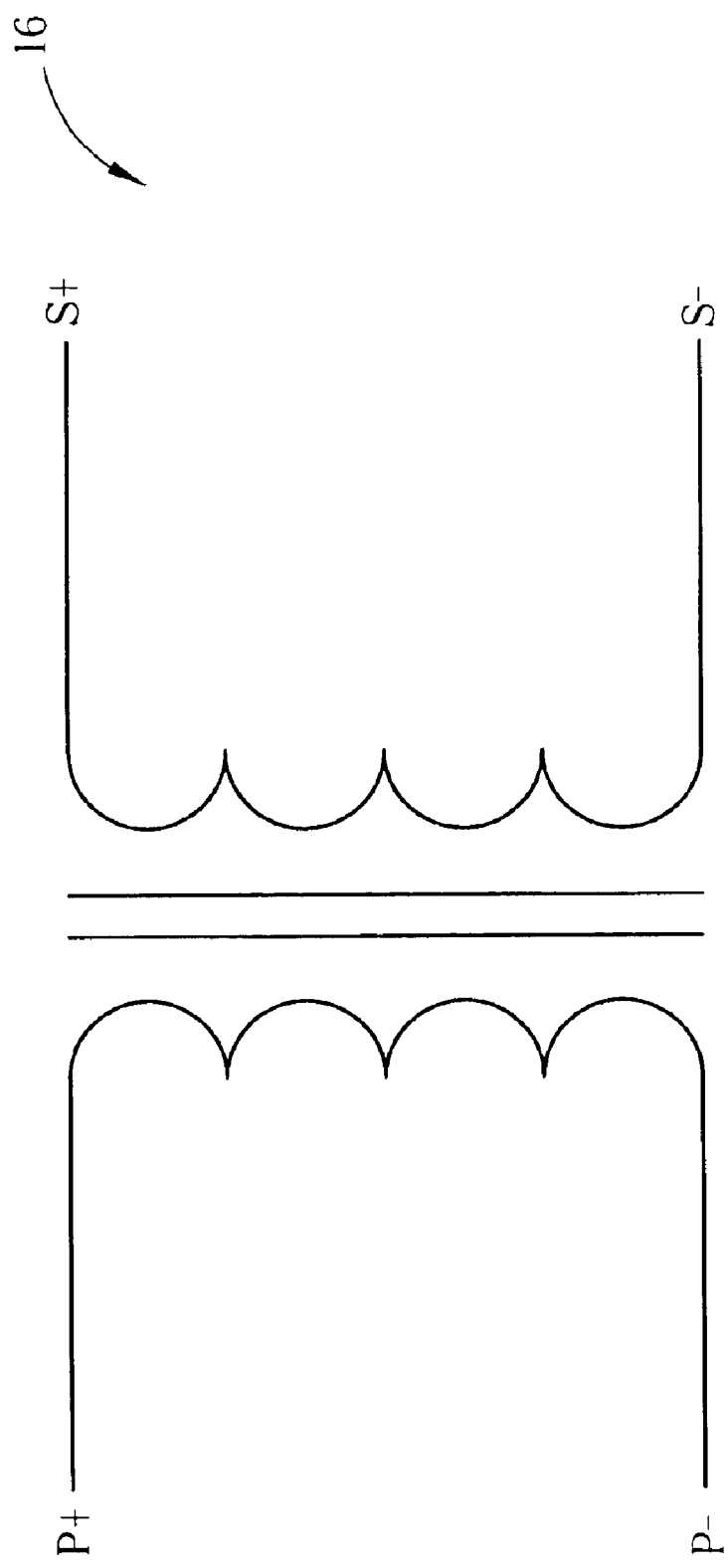
FIG. 3 is an equivalent circuit diagram of the transformer in FIG. 2.
Figure 4:
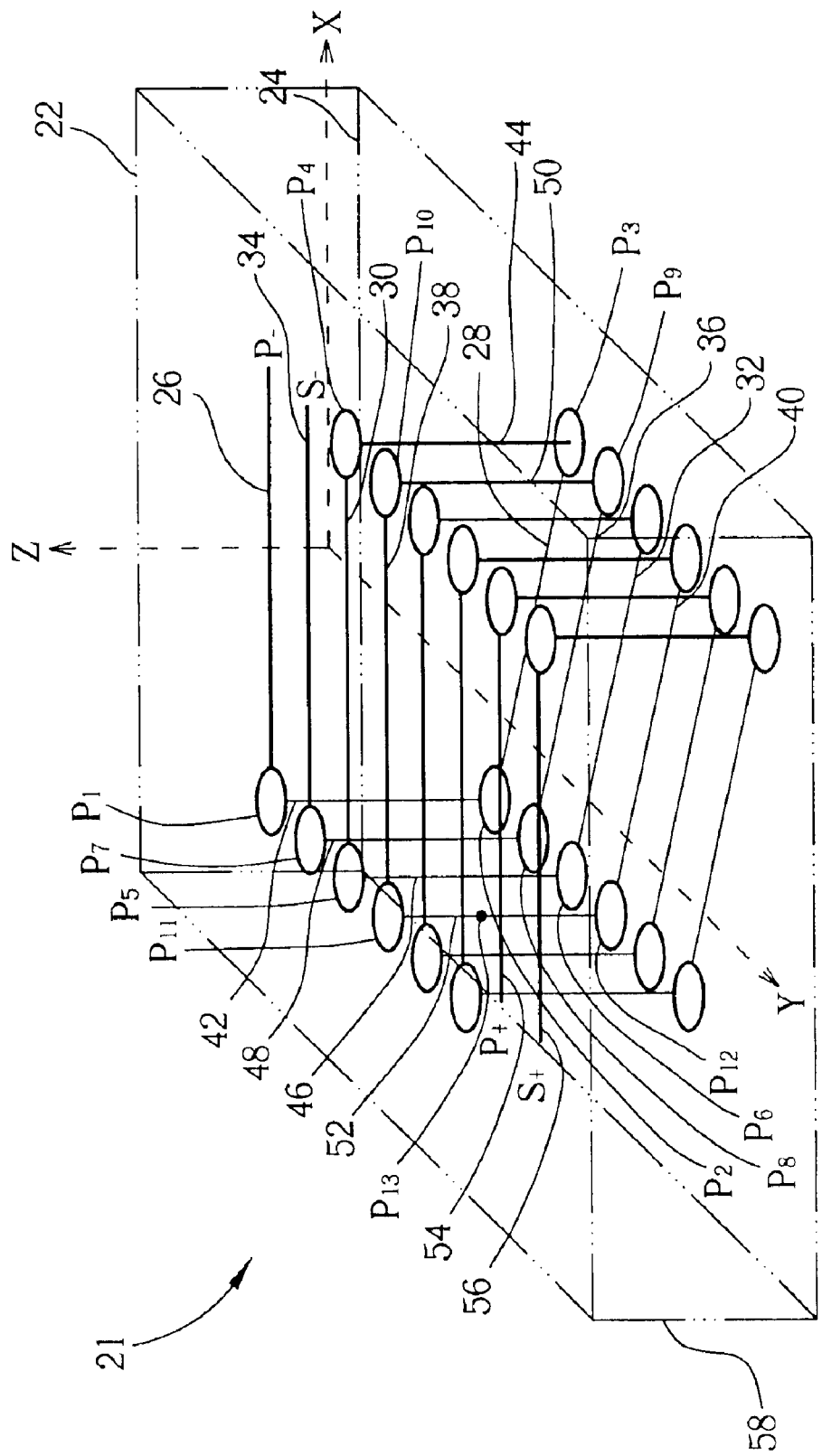
FIG. 4 is a layout diagram illustrating a transformer according to the present invention.

Please refer to FIG. 4 which is a layout diagram illustrating a transformer 21 according to the present invention. As shown in FIG. 4, the transformer 21 includes a printed circuit board 58, a first wiring layer 22 installed in the printed circuit board 58, a second wiring layer 24 installed in the printed circuit board 58, which is formed under the first wiring layer 22 and parallel to the a first wiring layer 22, a primary coil 54, and a secondary coil 56. The primary coil 54 includes two differential signal ends P+, P−, a first conductive trace 26 formed on the first wiring layer 22, a second conductive trace 28 formed on the second wiring layer 24, a third conductive trace 30 formed on the first wiring layer 22 and parallel to the first conductive trace 26, a fourth conductive trace 32 formed on the second wiring layer 24 and parallel to the second conductive trace 28, a first via plug 42 which is perpendicular to the first conductive trace 26 and connected to a first end P1 of the first conductive trace 26 and a first end P2 of the second conductive trace 28, a second via plug 44 which is perpendicular to the second conductive trace 28 and connected to a second end P3 of the second conductive trace 28 and a first end P4 of the third conductive trace 30, and a third via plug 46 which is perpendicular to the third conductive trace 30 and connected to a second end P5 of the third conductive trace 30 and a first end P6 of the fourth conductive trace 32. The secondary coil 56 includes two differential signal ends S+, S−, a fifth conductive trace 34 formed on the first wiring layer 26 and parallel to the first conductive trace 22, a sixth conductive trace 36 formed on the second wiring layer 28 and parallel to the second conductive trace 24, a seventh conductive trace 38 formed on the first wiring layer 22 and parallel to the fifth conductive trace 34, an eighth conductive trace 40 formed on the second wiring layer 24 and parallel to the sixth conductive trace 36, a fourth via plug 48 which is perpendicular to the fifth conductive trace 34 and connected to a first end P7 of the fifth conductive trace 34 and a first end P8 of the sixth conductive trace 36, a fifth via plug 50 which is perpendicular to the sixth conductive trace 36 and connected to a second end P9 of the sixth conductive trace 36 and a first end P10 of the seventh conductive trace 38, and a sixth via plug 52 which is perpendicular to the seventh conductive trace 38 and connected to a second end P11 of the seventh conductive trace 38 and a first end P12 of the eighth conductive trace 40. Wherein the fifth conductive trace 34 is formed between the first conductive trace 26 and the third conductive trace 30, and the third conductive trace 30 is formed between the fifth conductive trace 34 and the seventh conductive trace 38. The primary coil 54 and the secondary coil 56 are surrounded with insulating materials. Generally speaking, the transformer 21 is formed by two separate coils spiraling along the Y-axis, where each coil is formed by conductive traces traversing across the wiring layers and between the wiring layers through via plugs.

Figure 5:
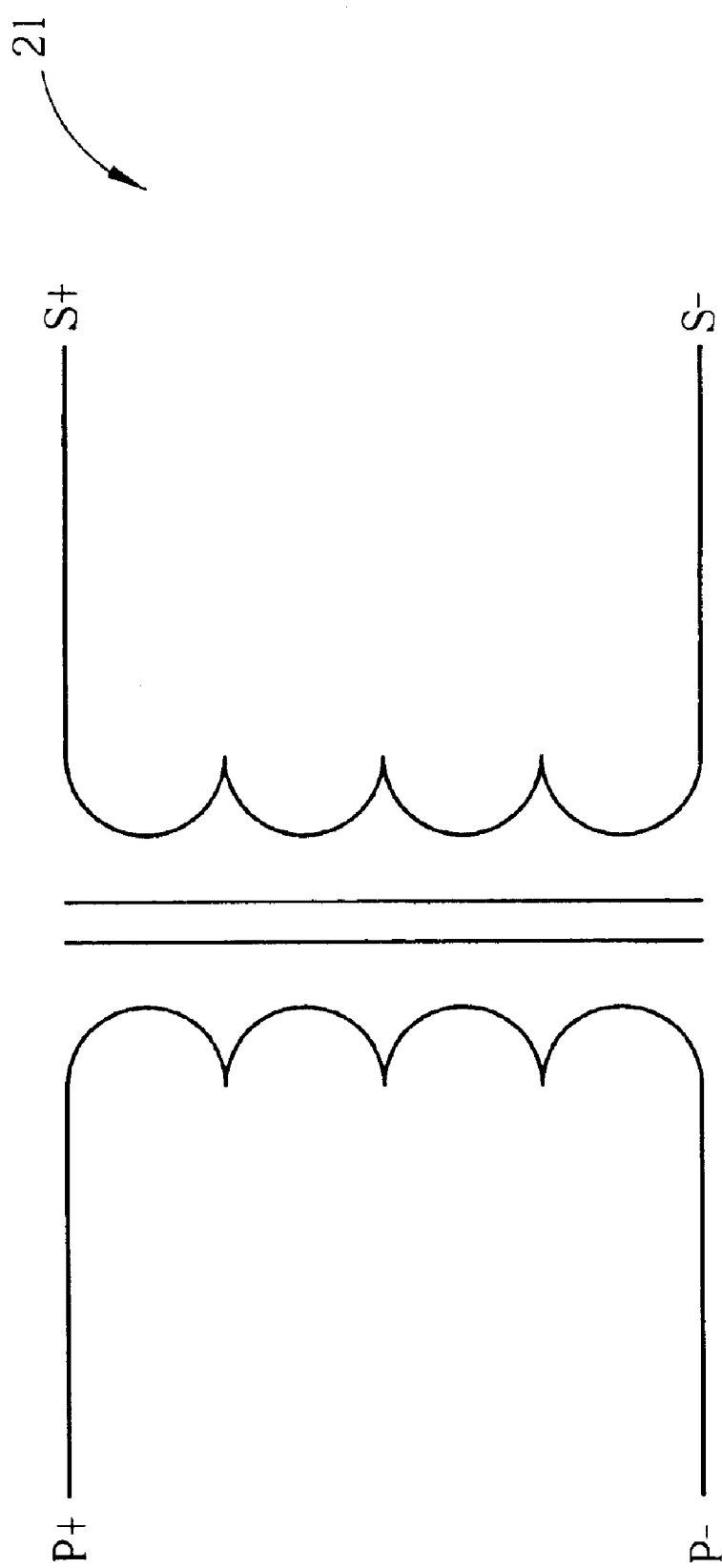
FIG. 5 is an equivalent circuit diagram illustrating the impedance conversion between two differential signals of the transformer shown in FIG. 4.

Please refer to FIG. 5 which is an equivalent circuit diagram illustrating the impedance conversion between two differential signals of the transformer 21. The transformer 21 is a balance-to-balance transformer and the impedance conversion between differential signal ends P+, P−, and S+, S− is determined by the ratio of the number of loops in the primary coil 18 to the number of loops in the secondary coil 20.

Figure 6:
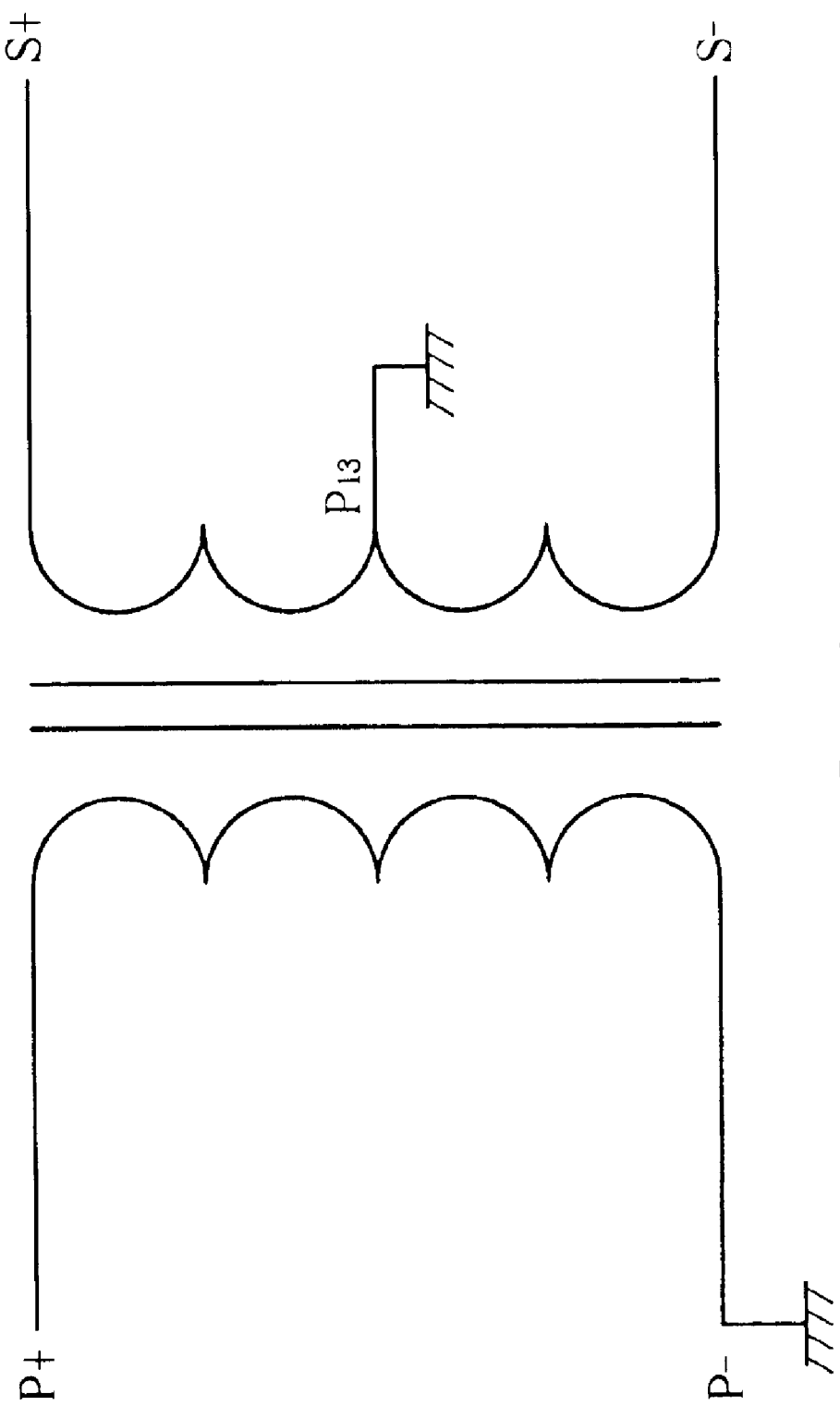
FIG. 6 is an equivalent circuit diagram illustrating a signal end P− of the primary coil being grounded and a signal end P13 of the secondary coil being grounded.

Please refer to FIG. 6 which is an equivalent circuit diagram illustrating a signal end P− of the primary coil 54 being grounded and a signal end P13 of the secondary coil 56 being grounded, i.e. an equivalent circuit diagram illustrating a single ended signal converted to a differential signal. In this situation, the transformer 21 is a balance-to-unbalance (BALUN) transformer.

Figure 7:
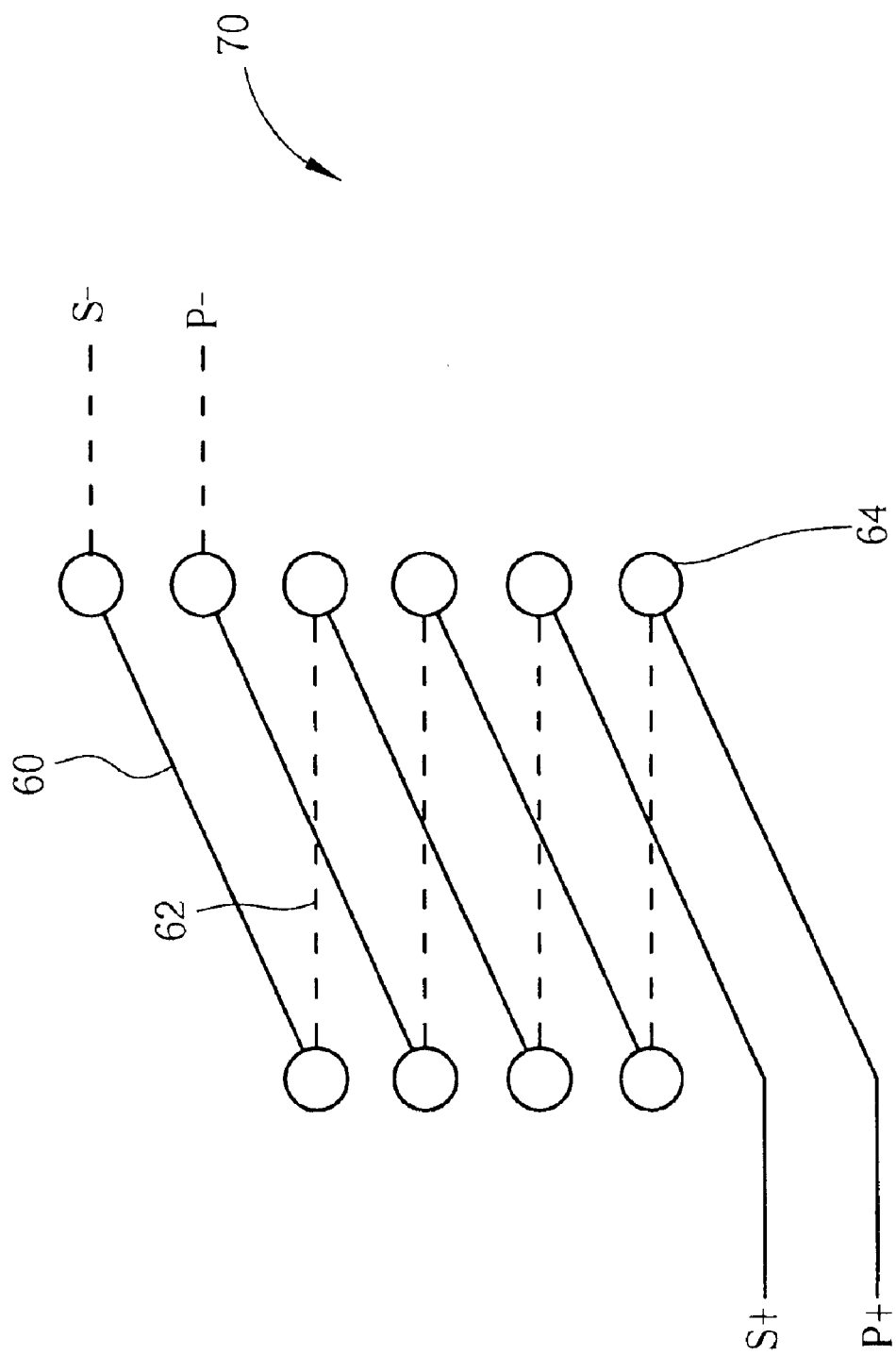
FIG. 7 to FIG. 9 illustrate three additional types of inductors according to the present invention.
Figure 8:
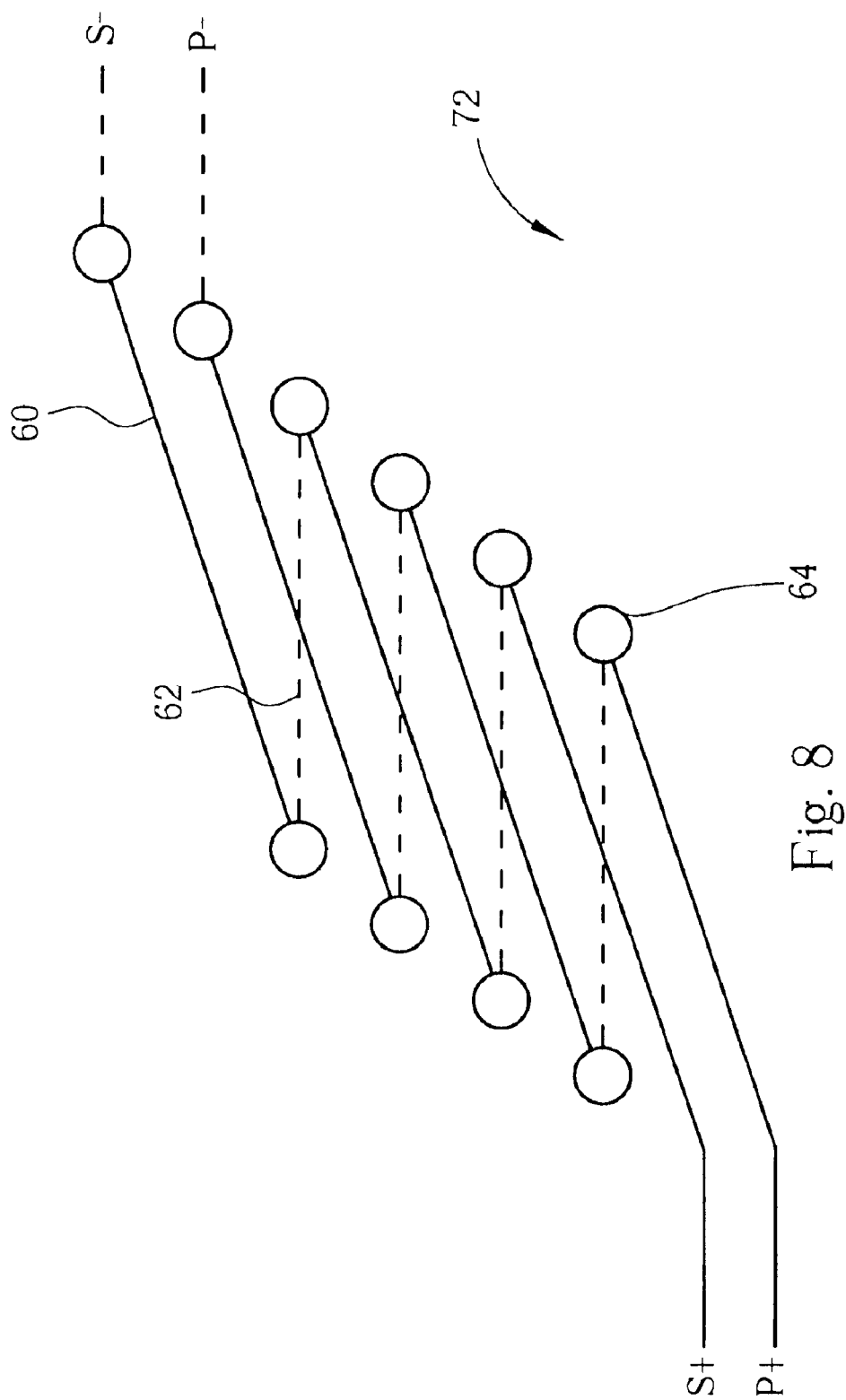
Figure 9:
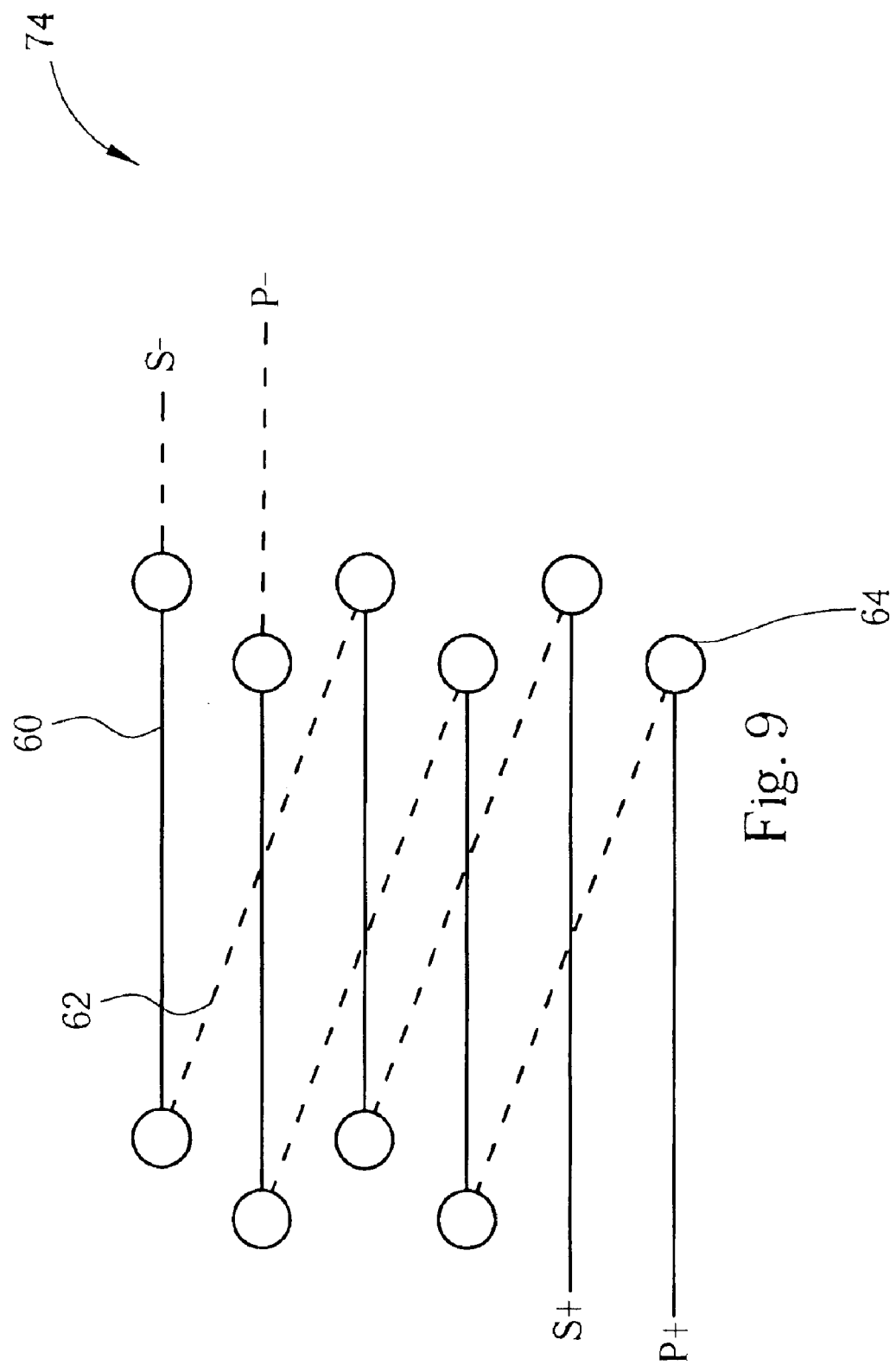

In order to comply with different layout requirements, the transformer 21 can be of varied forms. Please refer to FIG. 7 to FIG. 9 which illustrate three additional types of inductors 70, 72, 74 according to the present invention. In FIG. 7 to FIG. 9, conductive traces 60, shown as solid lines, are formed on a first wiring layer 22, and conductive traces 62, shown as broken lines, are formed on a second wiring layer 24. As shown in FIG. 7 to FIG. 9, the conductive traces 66 of the inductors 70, 72, 74 on the first wiring layer 22 are parallel to each other, and the conductive traces 62 on the second wiring layer 24 are also parallel to each other. In FIG. 7 and FIG. 8, via plugs 64 are positioned along two parallel lines, and in FIG. 9, the via plugs 64 are not aligned. In this way, the transformer 21 can differ in various forms to comply with the layout design requirements.

The transformer according to the present invention can be composed of multilayered coils and manufactured by printed circuit board technology. The transformer includes a plurality of coils in which primary coils and secondary coils are arranged alternately and isolated by a plurality of insulating layers. A plurality of via plugs perpendicular to conductive traces is used for connecting the coils on different layers. All multilayered transformers are in the range of the present invention.

Additionally, transformer according to the present invention can also be manufactured by integrated circuit technologies.

In contrast to the prior art, the present invention provides a three-dimensional embedded transformer, which can be in various forms to comply with different layout requirements, to replace the conventional planar transformer. The transformer according to the present invention requires a far smaller layout area so that the cost is reduced. Moreover, the primary coil and the secondary coil are connected via apertures to increase mutual induction of the two coils, therefore the transformer according to the present invention requires shorter conductive lines, and each coil can be a thicker conductive line in order to decrease the resistance and reduce power consumption. Thus, the transformer according to the present invention has a higher quality factor so that it can be applied widely in circuit design for high-frequency wireless communication. And due to the symmetry in the same layer, common mode noise is effectively reduced.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A printed circuit transformer comprising:
    a first wiring layer;
    a second wiring layer formed under and parallel to the first wiring layer;
    a primary coil comprising:
        a first conductive trace formed on the first wiring layer;
        a second conductive trace formed on the second wiring layer;
        a third conductive trace formed on the first wiring layer and parallel to the first conductive trace;
        a fourth conductive trace formed on the second wiring layer and parallel to the second conductive trace;
        a first via plug connected to a first end of the first conductive trace and a first end of the second conductive trace;
        a second via plug connected to a second end of the second conductive trace and a first end of the third conductive trace; and
        a third via plug connected to a second end of the third conductive trace and a first end of the fourth conductive trace; and a secondary coil comprising:
  a fifth conductive trace formed on the first wiring layer and parallel to the first conductive trace;
  a sixth conductive trace formed on the second wiring layer and parallel to the second conductive trace;
  a seventh conductive trace formed on the first wiring layer and parallel to the third conductive trace;
  an eighth conductive trace formed on the second wiring layer and parallel to the fourth conductive trace;
  a fourth via plug connected to a first end of the fifth conductive trace and a first end of the sixth conductive trace;
  a fifth via plug connected to a second end of the sixth conductive trace and a first end of the seventh conductive trace; and
  a sixth via plug connected to a second end of the seventh conductive trace and a first end of the eighth conductive trace.

2. The transformer of claim 1 wherein the first via plug is perpendicular to the first conductive trace, the second via plug is perpendicular to the second conductive trace, the third via plug is perpendicular to the third conductive trace, the fourth via plug is perpendicular to the fifth conductive trace, the fifth via plug is perpendicular to the sixth conductive trace, and the sixth via plug is perpendicular to the seventh conductive trace.

3. The transformer of claim 1 wherein the fifth conductive trace is formed between the first conductive trace and the third conductive trace, and the third conductive trace is formed between the fifth conductive trace and the seventh conductive trace.

4. The transformer of claim 1 being a balance-to-balance transformer.

5. The transformer of claim 1 being a balance-to-unbalance transformer.

6. A printed circuit transformer comprising:
  an insulating layer having a centerline and an end;
  a first wiring layer formed on a first surface of the insulating layer and having a first plurality of parallel traces extending across the centerline;
  a second wiring layer formed on a second surface of the insulating layer and having a second plurality of parallel traces extending across the centerline;
  a first plurality of vias extending from the first surface to the second surface and disposed on one side of the centerline, each via of the first plurality of vias respectively connecting the Nth trace of the first plurality of parallel traces with the Nth trace of the second plurality of parallel traces; and
  a second plurality of vias extending from the first surface to the second surface and disposed on an opposite side of the centerline, each via of the second plurality of vias respectively connecting the Nth trace of the second plurality of parallel traces with the (N+2)th trace of the first plurality of parallel traces;
  wherein N represents sequentially numbered first plurality of parallel traces and sequentially numbered second plurality of parallel traces, both being numbered according to relative distance from the end of the insulating layer.

7. The printed circuit transformer of claim 6 wherein traces of the first plurality of traces and of the second plurality of traces indicated by having an odd valued N form a primary transformer coil and traces of the first plurality of traces and of the second plurality of traces indicated by having an even valued N form a secondary transformer coil.

8. An integrated circuit transformer comprising:
  an insulating layer having a centerline and an end;
  a first wiring layer formed on the insulating layer and having a first plurality of parallel traces extending across the centerline;
  a second wiring layer formed underneath the insulating layer and having a second plurality of parallel traces extending across the centerline;
  a first plurality of vias extending from the first wiring layer to the second wiring layer and disposed on one side of the centerline, each via of the first plurality of vias respectively connecting the Nth trace of the first plurality of parallel traces with the Nth trace of the second plurality of parallel traces; and
  a second plurality of vias extending from the first wiring layer to the second wiring layer and disposed on an opposite side of the centerline, each via of the second plurality of vias respectively connecting the Nth trace of the second plurality of parallel traces with the (N+2)th trace of the first plurality of parallel traces;
  wherein N represents sequentially numbered first plurality of parallel traces and sequentially numbered second plurality of parallel traces, both being numbered according to relative distance from the end of the insulating layer.

9. The transformer of claim 8 wherein the integrated circuit transformer is formed on a silicon substrate.

10. The printed circuit transformer of claim 8 wherein traces of the first plurality of traces and of the second plurality of traces indicated by having an odd valued N form a primary transformer coil and traces of the first plurality of traces and of the second plurality of traces indicated by having an even valued N form a secondary transformer coil.

* * * * *